(12) United States Patent
Minamiura

(10) Patent No.: US 7,688,033 B2
(45) Date of Patent: Mar. 30, 2010

(54) METHOD FOR DETECTING STATE OF SECONDARY BATTERY AND DEVICE FOR DETECTING STATE OF SECONDARY BATTERY

(75) Inventor: Keiichi Minamiura, Utsunomiya (JP)

(73) Assignee: Panasonic EV Energy Co., Ltd., Kosai-Shi (JP)

( * ) Notice: Subject to any disclaimer, the term of this patent is extended or adjusted under 35 U.S.C. 154(b) by 540 days.

(21) Appl. No.: 11/227,535

(22) Filed: Sep. 15, 2005

(65) Prior Publication Data

US 2006/0066285 A1 Mar. 30, 2006

(30) Foreign Application Priority Data

Sep. 29, 2004 (JP) .............................. 2004-284793

(51) Int. Cl.
*H02J 7/00* (2006.01)
*H02J 7/04* (2006.01)

(52) U.S. Cl. ........................ 320/134; 320/137; 320/136; 320/157; 320/116

(58) Field of Classification Search ................. 320/134, 320/127, 132, 128, 138, 135, 116, 118, 148, 320/151, 152, 156, 157
See application file for complete search history.

(56) References Cited

U.S. PATENT DOCUMENTS 5,680,027 A * 10/1997 Hiratsuka et al. ........... 320/106

| | | | |
|---|---|---|---|
| 6,208,117 B1 * | 3/2001 | Hibi | 320/134 |
| 6,563,318 B2 * | 5/2003 | Kawakami et al. | 324/426 |
| 6,789,026 B2 * | 9/2004 | Barsoukov et al. | 702/63 |
| 6,841,972 B2 * | 1/2005 | Koo | 320/132 |
| 6,850,038 B2 * | 2/2005 | Arai et al. | 320/132 |
| 6,946,818 B2 * | 9/2005 | Cawthorne et al. | 320/134 |
| 7,233,128 B2 * | 6/2007 | Brost et al. | 320/132 |
| 2001/0021092 A1 * | 9/2001 | Astala | 361/90 |
| 2002/0195999 A1 * | 12/2002 | Kimura et al. | 320/134 |
| 2003/0231006 A1 * | 12/2003 | Tojima | 320/132 |
| 2004/0012373 A1 * | 1/2004 | Sakakibara et al. | 320/132 |

FOREIGN PATENT DOCUMENTS

JP 2000-323183 11/2000

* cited by examiner

*Primary Examiner*—Edward Tso
*Assistant Examiner*—Alexis Boateng
(74) *Attorney, Agent, or Firm*—Workman Nydegger

(57) ABSTRACT

Based on a plurality of valid data sets from a data set selection portion, an internal-resistance-during-charging calculation portion calculates the value Rc of internal resistance during charging from the slope of a voltage-current linear approximation during charging, and an internal-resistance-during-charging-and-discharging calculation portion calculates the value Rcd of internal resistance during charging and discharging from the slope of a voltage-current linear approximation during charging and discharging. A judgment portion compares the absolute value ΔR of the difference between Rcd and Rc that has been calculated by a difference computation portion with a first predetermined value ΔRT1, and when ΔR≦ΔRT1 is satisfied, the judgment portion outputs Rcd or Rc, whichever is smaller, as the value of internal resistance of a secondary battery.

10 Claims, 2 Drawing Sheets

METHOD FOR DETECTING STATE OF SECONDARY BATTERY AND DEVICE FOR DETECTING STATE OF SECONDARY BATTERY

BACKGROUND OF THE INVENTION

1. Field of the Invention

The present invention relates to a technology for estimating, while driving, the internal resistance (IR) of a secondary battery such as a nickel-metal hydride (Ni-MH) battery installed in a pure electric vehicle (PEV), a hybrid electric vehicle (HEV), or the like as a source of motive power for the motor and a source of driving power for various loads and for detecting the state of deterioration and an anomaly of the secondary battery.

2. Description of Related Art

Conventionally, it is well known that the internal resistance of a secondary battery is calculated to detect the state of deterioration or an anomaly of the secondary battery. In HEVs and other electric vehicles, when an output from the engine is greater than the motive power that is necessary for the vehicles to run, the surplus motive power is used to drive the generator so as to charge the secondary battery. Conversely, in HEVs and other electric vehicles, when an output from the engine is small, the electric power of the secondary battery is used to drive the motor so as to make up for the shortage of the output from the engine.

For example, JP 2000-323183A discloses a method for detecting the internal resistance of a secondary battery that is connected to a load consuming or regenerating such electric power. More specifically, the current I, voltage V, and temperature T during charging and discharging are first sampled over a predetermined period of time. Next, the sampled currents I are integrated to obtain the maximum amount of stored charge Qmax and the minimum amount of stored charge Qmin in that period, and furthermore, the difference $\Delta Q$ between these stored charges is obtained. Then, when all aspects, i.e., the difference $\Delta Q$ in the amount of stored charge, a distribution of the current I, and the temperature T, in that period are appropriate, a linear approximation of the sampled currents I and voltages V is obtained, and the internal resistance is calculated from the slope of the obtained straight line.

In this manner, the internal resistance of the secondary battery installed in HEVs and other electric vehicles is calculated based on the current I and voltage V that are measured as the vehicles are running.

However, even when the secondary battery is normal, the current I and voltage V that are measured during running may vary depending on the state of charging and discharging pattern at the time when the vehicle starts to run or stops running, for example. Moreover, in some cases, a small short-circuit occurs in the secondary battery, resulting in a deterioration in the secondary battery, and thus the voltage V decreases only during discharging. Consequently, it is difficult to obtain a correct value of internal resistance with the method described above.

SUMMARY OF THE INVENTION

The present invention is achieved in view of the foregoing problems, and it is an object of the present invention to provide a method for detecting the state of a secondary battery and a device for detecting the state of a secondary battery that can improve the accuracy in estimating the value of internal resistance of the secondary battery as vehicles are running, and that can diagnose the deterioration level and an anomaly of the secondary battery.

In order to attain the object, the method for detecting the state of a secondary battery according to the present invention includes: (a) a step of acquiring a plurality of data sets associating a current flowing through the secondary battery with a terminal voltage of the secondary battery corresponding to that current; (b) a step of making the plurality of data sets valid when specific selection conditions are satisfied; (c) a step of performing statistical processing with respect to the plurality of valid data sets during charging and discharging, and calculating a value of internal resistance during charging and discharging of the secondary battery from the slope of a linear approximation obtained by the statistical processing; (d) a step of performing statistical processing with respect to the plurality of valid data sets during charging, and calculating a value of internal resistance during charging of the secondary battery from the slope of a linear approximation obtained by the statistical processing; and (e) a step of calculating a value of internal resistance of the secondary battery based on the value of internal resistance during charging and discharging and the value of internal resistance during charging.

When the secondary battery suffers deterioration (small short-circuit), the voltage during charging is almost equal to the ordinary voltage, so that the value of internal resistance obtained from the voltage-current linear approximation during charging is the original value of internal resistance. On the other hand, in this case, the voltage during discharging decreases, so that the value of internal resistance obtained from the voltage-current linear approximation during charging and discharging and the value of internal resistance obtained from the voltage-current linear approximation during charging are not equal to each other. For this reason, the method for detecting the state of a secondary battery according to the present invention calculates the value of internal resistance more accurately by referencing the value of internal resistance obtained from the voltage-current linear approximation during charging in addition to the value of internal resistance obtained from the voltage-current linear approximation during charging and discharging.

It is possible that the method for detecting the state of a secondary battery according to the present invention further includes a step of judging whether or not an absolute value ($\Delta R = |Rcd - Rc|$) of the difference between the value (Rcd) of internal resistance during charging and discharging and the value (Rc) of internal resistance during charging is equal to or less than a first predetermined value ($\Delta RT1$), wherein, in step (e), when the absolute value ($\Delta R = |Rcd - Rc|$) of the difference between the value (Rcd) of internal resistance during charging and discharging and the value (Rc) of internal resistance during charging is equal to or less than the first predetermined value ($\Delta RT1$), then the value of internal resistance of the secondary battery is calculated.

In this case, it is preferable that in step (e), when the absolute value ($\Delta R = |Rcd - Rc|$) of the difference between the value (Rcd) of internal resistance during charging and discharging and the value (Rc) of internal resistance during charging is equal to or less than the first predetermined value ($\Delta RT1$), then the value (Rcd) of internal resistance during charging and discharging or the value (Rc) of internal resistance during charging, whichever is smaller, (min(Rcd, Rc)) is used as the value (IR) of internal resistance of the secondary battery.

Moreover, it is also possible that the method further includes: a step of judging whether or not the value (Rcd) of internal resistance during charging and discharging is greater than the value (Rc) of internal resistance during charging; and a step of judging whether or not the difference (Rcd−Rc) between the value (Rcd) of internal resistance during charging and discharging and the value (Rc) of internal resistance during charging is greater than a second predetermined value ($\Delta$RT2) that is greater than the first predetermined value ($\Delta$RT1), wherein, in step (e), when the absolute value ($\Delta$R=|Rcd−Rc|) of the difference between the value (Rcd) of internal resistance during charging and discharging and the value (Rc) of internal resistance during charging is greater than the first predetermined value ($\Delta$RT1), and further the value (Rcd) of internal resistance during charging and discharging is greater than the value (Rc) of internal resistance during charging and the difference (Rcd−Rc) between the value (Rcd) of internal resistance during charging and discharging and the value (Rc) of internal resistance during charging is greater than the second predetermined value ($\Delta$RT2), then a judgment that the secondary battery has deteriorated is made instead of calculating the value (IR) of internal resistance of the secondary battery.

Moreover, it is preferable that the method for detecting the state of a secondary battery according to the present invention further includes a step of setting the first predetermined value and a second predetermined value according to the temperature of the secondary battery. In this manner, it is possible to obtain a correct value of internal resistance giving consideration to a change in the battery temperature, and it also is possible to make a correct judgment on deterioration.

Furthermore, the specific selection conditions may be conditions that are dependent on at least the change ($\Delta$Q) in the amount of stored charge (Q) of the secondary battery in a predetermined period of time, ranges of current values of the secondary battery in a charging direction and a discharging direction (current value Ic(n) in charging direction (−) and current value Icd(n) in discharging direction (+)), the numbers (Nc in charging direction and Ncd in discharging direction) of the data sets in the charging direction and the discharging direction, and the temperature (T(n)) of the secondary battery. The specific selection conditions are, for example, $\Delta$Q<0.3 Ah, −50 A<Ic(n)<0, 0<Icd(n)<+50 A, Nc out of 60 samples >10, Ncd out of 60 samples >10, 20° C.$\leqq$T(n)$\leqq$50° C., and the deviation in T(n)$\leqq$5° C.

In order to attain the object, the device for detecting the state of a secondary battery according to the present invention includes: a current measurement portion that measures the current flowing through the secondary battery as current data (I(n)); a voltage measurement portion that measures the terminal voltage of the secondary battery as voltage data (V(n)); a data set selection portion that acquires a plurality of data sets including the current data from the current measurement portion and the voltage data from the voltage measurement portion that corresponds to the current data, and that outputs the plurality of data sets as valid data sets (Se(V(n), I(n))) when specific selection conditions are satisfied; an internal-resistance-during-charging-and-discharging calculation portion that performs statistical processing with respect to the plurality of valid data sets during charging and discharging, and calculating a value (Rcd) of internal resistance during charging and discharging of the secondary battery from the slope of a linear approximation obtained by the statistical processing; an internal-resistance-during-charging calculation portion that performs statistical processing with respect to the plurality of valid data sets during charging, and calculating a value (Rc) of internal resistance during charging of the secondary battery from the slope of a linear approximation obtained by the statistical processing; a difference computation portion that calculates an absolute value ($\Delta$R=|Rcd−Rc|) of the difference between the value of internal resistance during charging and discharging and the value of internal resistance during charging, and that also outputs a signal indicating the magnitude correlation between the value of internal resistance during charging and discharging and the value of internal resistance during charging; and a judgment portion that judges whether or not the absolute value ($\Delta$R) of the difference from the difference computation portion is equal to or less than a first predetermined value ($\Delta$RT1), and that outputs the value (Rcd) of internal resistance during charging and discharging or the value (Rc) of internal resistance during charging, whichever is smaller, (min(Rcd, Rc)) as a value (IR) of internal resistance of the secondary battery when the absolute value of the difference is equal to or less than the first predetermined value.

When the secondary battery suffers deterioration (small short-circuit), the voltage during charging is almost equal to the ordinary voltage, so that the value of internal resistance obtained from the voltage-current linear approximation during charging is the original value of internal resistance. On the other hand, in this case, the voltage during discharging decreases, so that the value of internal resistance obtained from the voltage-current linear approximation during charging and discharging and the value of internal resistance obtained from the voltage-current linear approximation during charging are not equal to each other. For this reason, the device for detecting the state of a secondary battery according to the present invention calculates the value of internal resistance more accurately by referencing the value of internal resistance obtained from the voltage-current linear approximation during charging in addition to the value of internal resistance obtained from the voltage-current linear approximation during charging and discharging.

It is preferable that in the device for detecting the state of a secondary battery according to the present invention, when the absolute value of the difference between the value of internal resistance during charging and discharging and the value of internal resistance during charging is greater than the first predetermined value, and further the value of internal resistance during charging and discharging is greater than the value of internal resistance during charging and the difference between the value of internal resistance during charging and discharging and the value of internal resistance during charging is greater than a second predetermined value that is greater than the first predetermined value, then the judgment portion judges that the secondary battery has deteriorated.

It is preferable that the device for detecting the state of a secondary battery according to the present invention further includes: a temperature measurement portion that measures the temperature (T(n)) of the secondary battery; and a predetermined value setting portion that sets the first predetermined value and a second predetermined value according to the temperature of the secondary battery. In this manner, it is possible to obtain a correct value of internal resistance giving consideration to a change in the battery temperature, and it also is possible to make a correct judgment on deterioration.

It is preferable that the device for detecting the state of a secondary battery according to the present invention further includes: a stored charge amount change calculation portion that obtains a change ($\Delta$Q) in the amount of stored charge (Q) of the secondary battery in a predetermined period of time; and a temperature measurement portion that measures the temperature (T(n)) of the secondary battery, wherein the specific selection conditions including at least the change ($\Delta$Q) in the amount of stored charge in the predetermined period of time, ranges of current values of the secondary battery in a charging direction and a discharging direction (current value Ic(n) in charging direction (−) and current value Icd(n) in discharging direction (+)), the numbers (Nc in charging direction and Ncd in discharging direction) of the data sets in the charging direction and the discharging direction, the temperature (T(n)) of the secondary battery, and the deviation in the temperature (T(n)) of the secondary battery are satisfied, then the data set selection portion makes the plurality of data sets valid. The specific selection conditions are, for example, ΔQ<0.3 Ah, −50 A<Ic(n)<0, 0<Icd(n)<+50 A, Nc out of 60 samples >10, Ncd out of 60 samples >10, 20° C.≦T(n)≦50° C. (a region where the temperature dependency of the value of internal resistance is small), and the deviation in T(n)≦5° C.

DETAILED DESCRIPTION OF THE INVENTION

Figure 1:
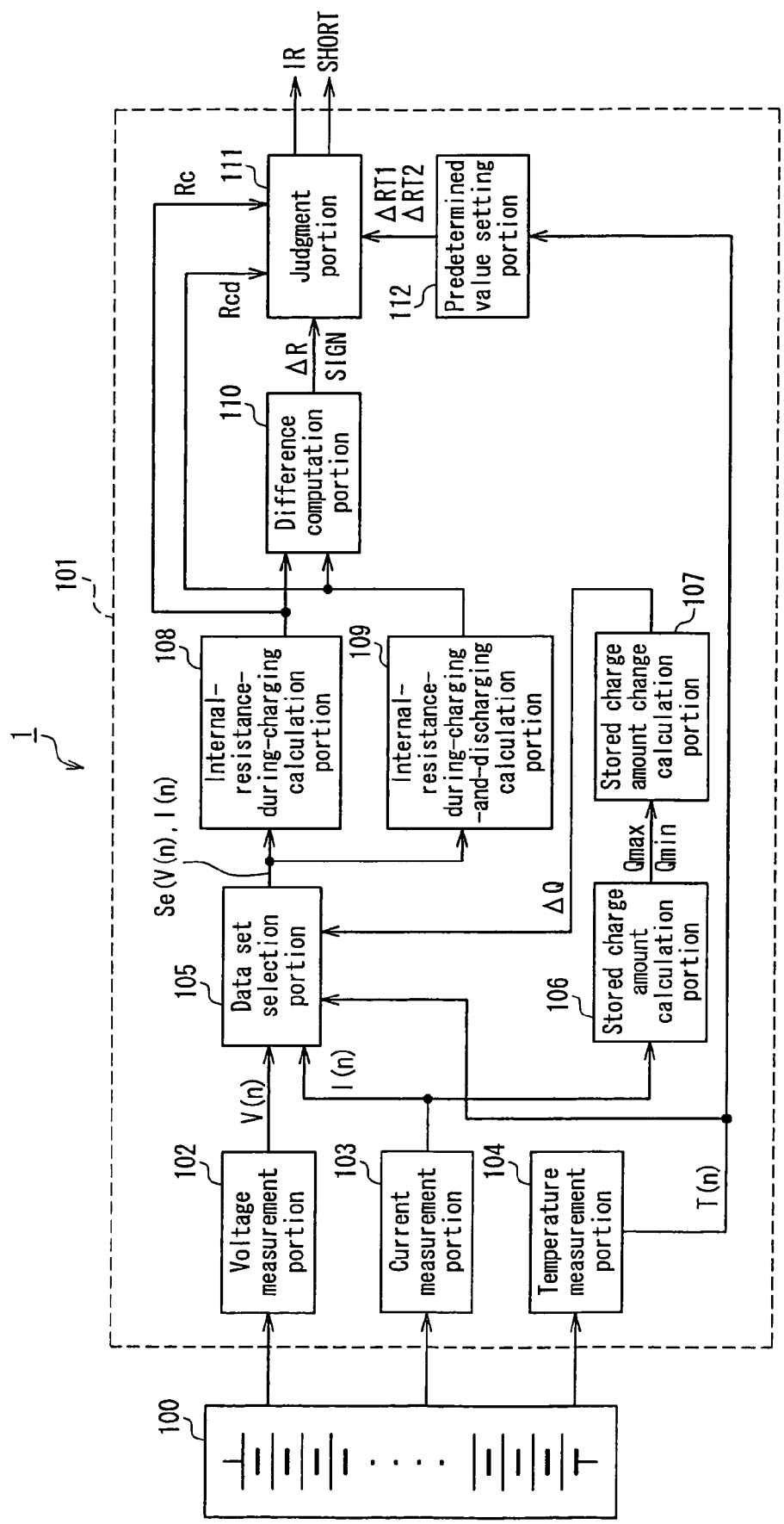
FIG. 1 is a block diagram showing an example of the configuration of a battery pack system according to an embodiment of the present invention.

Hereinafter, preferred embodiments of the present invention will be described with reference to the drawings. FIG. 1 is a block diagram showing an example of the configuration of a battery pack system according to an embodiment of the present invention.

As shown in FIG. 1, the battery pack system 1 is provided with a secondary battery 100 that is formed by combining a plurality of single cells or unit cells and a battery electronic control unit (hereinafter, abbreviated as "battery ECU") 101 that contains the device for detecting the state of a secondary battery according to the present invention as a part of a microcomputer system.

In the battery ECU 101, reference numeral 102 indicates a voltage measurement portion that measures the terminal voltage of the secondary battery 100 detected by a voltage sensor (not shown) at a predetermined sampling period (one second, for example) to obtain voltage data V(n). Reference numeral 103 indicates a current measurement portion that measures the charging or discharging current of the secondary battery 100 detected by a current sensor (not shown) at a predetermined sampling period to obtain current data I(n) (the sign of which indicates either the charging direction (−) or the discharging direction (+)). Reference numeral 104 indicates a temperature measurement portion that measures the temperature of the secondary battery 100 detected by a temperature sensor (not shown) to obtain temperature data T(n).

The voltage data V(n) from the voltage measurement portion 102 and the current data I(n) from the current measurement portion 103 are input as data sets to a data set selection portion 105. The temperature data T(n) measured by the temperature measurement portion 104 is input to the data set selection portion 105 and a predetermined value setting portion 112.

The current data I(n) also is input to a stored charge amount calculation portion 106. The stored charge amount calculation portion 106 integrates the sampled current data I(n), thereby calculating the amount of stored charge Q. The calculated amount of stored charge Q is then input to a stored charge amount change calculation portion 107. The stored charge amount change calculation portion 107 obtains the difference between the maximum amount of stored charge Qmax and the minimum amount of stored charge Qmin during sampling, and outputs the difference as the change ΔQ in the amount of stored charge to the data set selection portion 105.

When specific selection conditions are satisfied, the data set selection portion 105 determines that the data sets consisting of the voltage data V(n) and the current data I(n) are valid, and outputs these data sets as valid data sets Se(V(n), I(n)). The specific selection conditions include, for example, that the values of the current data I(n) (Ic(n), Icd(n)) in the charging direction (−) and the discharging direction (+) are within a predetermined range, that the numbers of data sets in the charging direction and the discharging direction are greater than or equal to a predetermined number, that the change ΔQ in the amount of stored charge Q in a predetermined period of time (one minute, for example) is within a predetermined range, and that the temperature data T(n) is within a predetermined range and the deviation in the temperature data T(n) is within a predetermined value.

More specifically, an example of the conditions with respect to the current data I(n) is that −50 A<Ic(n)<0 and 0<Icd(n)<+50 A. An example of the conditions with respect to the numbers of data sets is that when sixty samples were taken, both the number of acquired data sets in the charging direction and the number of acquired data sets in the discharging direction are greater than 10 (the number Nc of data sets in the charging direction >10 and the number Ncd of data sets in the discharging direction >10). An example of the conditions with respect to the change ΔQ in the amount of stored charge Q is that the change ΔQ in the amount of stored charge Q in one minute is less than 0.3 Ah. Moreover, an example of the conditions with respect to the temperature data T(n) is that the temperature data T(n) is within a range of 20° C. to 50° C. (a region where the temperature dependency of the value of internal resistance is small) and further the deviation in the temperature data T(n) is 5° C. or less.

The data set selection portion 105 outputs the valid data sets Se(V(n), I(n)) to an internal-resistance-during-charging calculation portion 108 and an internal-resistance-during-charging-and-discharging calculation portion 109. The internal-resistance-during-charging calculation portion 108 obtains a first-order voltage-current straight line (linear approximation) from the valid data sets during charging by statistical processing such as regression analysis using the method of least squares or other techniques, and then calculates the value Rc of internal resistance during charging of the secondary battery 100 from the slope of the linear approximation. On the other hand, the internal-resistance-during-charging-and-discharging calculation portion 109 obtains a first-order voltage-current straight line (linear approximation) from the valid data sets during charging and discharging by statistical processing such as regression analysis using the method of least squares or other techniques, and then calculates the value Rcd of internal resistance during charging and discharging of the secondary battery 100 from the slope of the linear approximation.

The value Rcd of internal resistance during charging and discharging and the value Rc of internal resistance during charging are input to a difference computation portion 110. The difference computation portion 110 calculates the absolute value ΔR (=|Rcd−Rc|) of the difference between these values. Moreover, the difference computation portion 110 outputs the absolute value ΔR in conjunction with a signal SIGN indicating the magnitude correlation between the value Rcd of internal resistance during charging and discharging and the value Rc of internal resistance during charging to a judgment portion 111. The signal SIGN is represented as SIGN=(+) if the value Rcd of internal resistance during charging and discharging is greater than the value Rc of internal resistance during charging, and it is represented as SIGN=(−) if not. The judgment portion 111 also receives a first predetermined value ΔRT1 and a second predetermined value ΔRT2 corresponding to the temperature data T(n) from the predetermined value setting portion 112.

The judgment portion 111 determines whether or not the absolute value ΔR of the difference is equal to or less than the first predetermined value ΔRT1. When the absolute value ΔR of the difference is equal to or less than the first predetermined value ΔRT1, the judgment portion 111 outputs the value Rcd of internal resistance during charging and discharging or the value Rc of internal resistance during charging, whichever is smaller, i.e., min(Rc, Rcd), as the value IR of internal resistance of the secondary battery 100.

Moreover, when the judgment portion 111 determines that the absolute value ΔR of the difference is greater than the first predetermined value ΔRT1, then it further determines whether or not the signal is SIGN=(+) (whether or not the value Rcd of internal resistance during charging and discharging is greater than the value Rc of internal resistance during charging) and whether or not the absolute value ΔR of the difference is greater than the second predetermined value ΔRT2.

When the determination result is that the signal is SIGN=(+) (the value Rcd of internal resistance during charging and discharging is greater than the value Rc of internal resistance during charging) and the absolute value ΔR of the difference is greater than the second predetermined value ΔRT2, the judgment portion 111 determines that a small short-circuit has occurred in the secondary battery 100. In this case, the judgment portion 111 outputs a short-circuit detection signal SHORT, assuming that the secondary battery 100 has deteriorated.

Here, when the battery has not deteriorated, the value Rcd of internal resistance during charging and discharging and the value Rc of internal resistance during charging are almost equal to each other. However, when a small short-circuit occurs, the difference between the value Rcd of internal resistance during charging and discharging and the value Rc of internal resistance during charging increases gradually as the battery deteriorates. Therefore, the second predetermined value ΔRT2 is set to a value greater than the first predetermined value ΔRT1.

The predetermined value setting portion 112 specifies the first predetermined value ΔRT1 corresponding to the temperature data T(n) by applying the value of the temperature data T(n) to a formula or table that has been obtained in advance and that specifies the relationship between the temperature of the secondary battery and the first predetermined value ΔRT1, and then outputs the specified value to the judgment portion 111.

The formula or table that specifies the relationship between the temperature of the secondary battery and the first predetermined value ΔRT1 can be created in the following manner. First, a secondary battery that works sufficiently as a source of motive power for motors or a source of driving power for various loads but whose value Rcd of internal resistance during charging and discharging has increased to about twice as much as that when the battery has not yet deteriorated is prepared. Next, the battery temperature is set to an arbitrary temperature, and the values Rc and Rcd of internal resistance at that temperature are measured to obtain the difference between them. The obtained difference is the first predetermined value ΔRT1 at the set temperature. After this, the battery temperature is set again to a different temperature, and the same process is repeated, and thus the first predetermined value ΔRT1 for each battery temperature can be obtained. Furthermore, if a graph is created, in which a vertical axis represents the obtained first predetermined value ΔRT1 and a horizontal axis represents the temperature, and the graph is approximated in a mathematical expression, a relationship between the first predetermined value ΔRT1 and the temperature is obtained. The relationship or table for the first predetermined value ΔRT1 is stored in the predetermined value setting portion 112.

Moreover, as is the case with the first predetermined value ΔRT1, the predetermined value setting portion 112 specifies the second predetermined value ΔRT2 corresponding to the temperature data T(n) by applying the value of the temperature data T(n) to a formula or table that has been obtained in advance and that specifies the relationship between the temperature of the secondary battery and the second predetermined value ΔRT2. The predetermined value setting portion 112 outputs the specified second predetermined value ΔRT2 to the judgment portion 111.

The formula or table that specifies the relationship between the temperature of the secondary battery and the second predetermined value ΔRT2 can be created in the following manner. First, a secondary battery, the use of which as a source of motive power for motors or a source of driving power for various loads has become difficult and whose value Rcd of internal resistance during charging and discharging has increased to, for example, more than four times that when the battery has not yet deteriorated, is prepared. Next, the battery temperature is set to an arbitrary temperature, and the values Rc and Rcd of internal resistance at that temperature are measured to obtain the difference between them. The obtained difference is the second predetermined value ΔRT2 at the set temperature. After this, the battery temperature is set again to a different temperature, and the same process is repeated, and thus the second predetermined value ΔRT2 for each battery temperature can be obtained. Also in this case, if a graph is created, in which a vertical axis represents the obtained second predetermined value ΔRT2 and a horizontal axis represents the temperature, and the graph is approximated in a mathematical expression, a relationship between the second predetermined value ΔRT2 and the temperature is obtained. The relationship or table for the second predetermined value ΔRT2 also is stored in the predetermined value setting portion 112.

Figure 2:
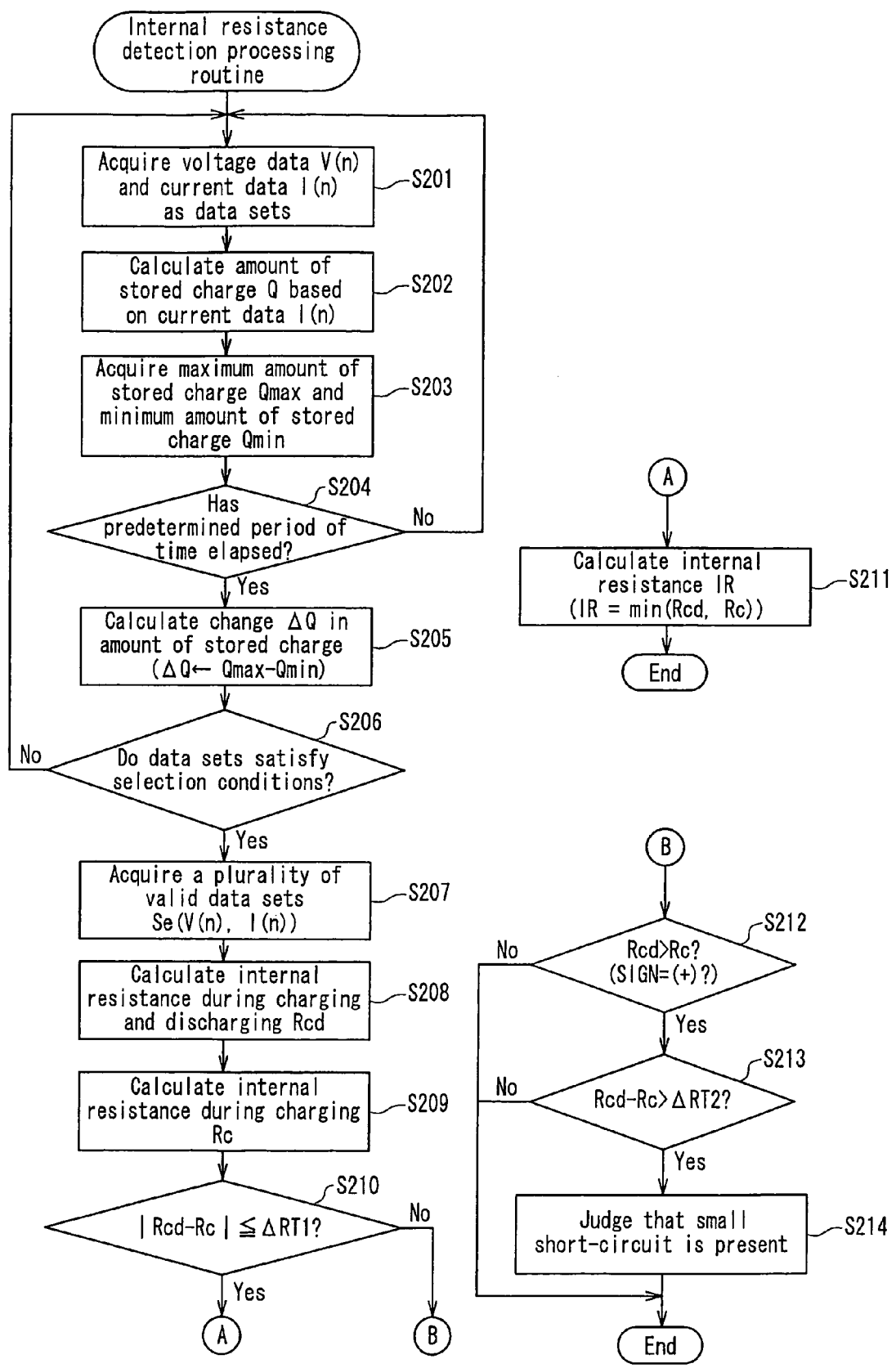
FIG. 2 is a flowchart showing an internal resistance detection processing routine in the method for detecting the state of a secondary battery according to an embodiment of the present invention.

FIG. 2 is a flowchart showing an internal resistance detection processing routine in the method for detecting the state of a secondary battery according to an embodiment of the present invention. As shown in FIG. 2, the voltage measurement portion 102 and the current measurement portion 103 first acquire voltage data V(n) and current data I(n) as data sets (step S201).

Next, the stored charge amount calculation portion 106 integrates current data I(n) with respect to the initial amount of stored charge at every sampling period (Δt: one second, for example) to calculate the amount of stored charge Q (Q←Q−I(n)×Δt) (step S202). Furthermore, the stored charge amount calculation portion 106 compares the amount of stored charge Q calculated now with the amount of stored charge obtained by previous sampling to acquire the maximum amount of stored charge Qmax and the minimum amount of stored charge Qmin (step S203), and outputs them to the stored charge amount change calculation portion 107.

Next, the stored charge amount change calculation portion 107 determines whether or not a predetermined period of time (one minute, for example) has elapsed (step S204). When the predetermined period of time has not elapsed (No), the steps S201 to S204 are executed again.

On the other hand, when it is determined in the step S204 that the predetermined period of time has elapsed (Yes), the stored charge amount change calculation portion 107 subtracts the minimum amount of stored charge Qmin from the maximum amount of stored charge Qmax to calculate the change ΔQ in the amount of stored charge Q (step S205), and outputs the calculated value to the data set selection portion 105.

Next, the data set selection portion 105 determines whether or not the data sets acquired in the predetermined period of time satisfy the specific selection conditions as described above (step S206). When the specific selection conditions as described above are not satisfied (No), the steps S201 to S205 are executed again. On the other hand, when it is determined in the step S206 that the specific selection conditions are satisfied (Yes), the data set selection portion 105 acquires a plurality of valid data sets Se(V(n), I(n)) (step S207), and outputs these data sets to the internal-resistance-during-charging calculation portion 108 and the internal-resistance-during-charging-and-discharging calculation portion 109.

Next, the internal-resistance-during-charging-and-discharging calculation portion 109 obtains a first-order voltage-current straight line (linear approximation) from the valid data sets during charging and discharging by statistical processing such as regression analysis using the method of least squares or other techniques, and then calculates the value Rcd of internal resistance during charging and discharging of the secondary battery 100 from the slope of the linear approximation (step S208). Moreover, the internal-resistance-during-charging calculation portion 108 obtains a first-order voltage-current straight line (linear approximation) from the valid data sets during charging by statistical processing such as regression analysis using the method of least squares or other techniques, and then calculates the value Rc of internal resistance during charging of the secondary battery 100 from the slope of the linear approximation (step S209).

Next, the difference computation portion 110 calculates the absolute value ΔR (|Rcd−Rc|) of the difference between the value Rcd of internal resistance during charging and discharging and the value Rc of internal resistance during charging, and furthermore, the judgment portion 111 determines whether or not the absolute value ΔR is equal to or less than the first predetermined value ΔRT1 (step S210).

Here, when the secondary battery 100 suffers deterioration (small short-circuit), the voltage during charging is almost equal to the ordinary voltage, so that the value Rc of internal resistance obtained from the voltage-current linear approximation during charging is the original value of internal resistance, and the voltage decreases only during discharging. Thus, the value Rcd of internal resistance obtained from the voltage-current linear approximation during charging and discharging and the value Rc of internal resistance obtained from the voltage-current linear approximation during charging are not equal to each other. For this reason, in the step S210, the judgment portion 111 compares the value Rcd of internal resistance obtained from the voltage-current linear approximation during charging and discharging with the value Rc of internal resistance obtained from the voltage-current linear approximation during charging, and determines whether or not the absolute value of the difference between those values is equal to or less than the first predetermined value ΔRT1.

Before the judgment portion 111 executes the step S210, the predetermined value setting portion 112 sets the first predetermined value ΔRT1 and the second predetermined value ΔRT2 based on temperature data T(n) acquired by the temperature measurement portion 104. This step by the predetermined value setting portion 112 can be performed at any stage before execution of the step S210.

When it is determined in the step S210 that |Rcd−Rc|≦ΔRT1 is satisfied (Yes), the judgment portion 111 calculates the value Rcd of internal resistance obtained from the voltage-current linear approximation during charging and discharging or the value Rc of internal resistance obtained from the voltage-current linear approximation during charging, whichever is smaller, as the value IR of internal resistance of the secondary battery 100 (step S211).

However, when it is determined in the step S210 that |Rcd−Rc|≦ΔRT1 is not satisfied (No), the judgment portion 111 determines whether or not the value Rcd of internal resistance obtained from the voltage-current linear approximation during charging and discharging is greater than the value Rc of internal resistance obtained from the voltage-current linear approximation during charging (SIGN=(+)?) (step S212). When the secondary battery 100 suffers deterioration (small short-circuit), the voltage decreases only during discharging, and the voltage during charging is almost equal to the ordinary voltage. Therefore, when the secondary battery 100 has deteriorated, the value Rcd of internal resistance obtained from the voltage-current linear approximation during charging and discharging is greater than the value Rc of internal resistance obtained from the voltage-current linear approximation during charging. Accordingly, in the reverse case, this routine is judged invalid and finished.

When it is determined in the step S212 that Rcd>Rc (Yes), the judgment portion 111 determines whether or not the difference between the value Rcd of internal resistance obtained from the voltage-current linear approximation during charging and discharging and the value Rc of internal resistance obtained from the voltage-current linear approximation during charging is greater than the second predetermined value ΔRT2 (step S213). When the difference is greater than the second predetermined value ΔRT2 (Yes), the judgment portion 111 judges that a small short-circuit is present in the secondary battery 100 (step S214), and finishes this routine. On the other hand, when the difference is not greater than the second predetermined value ΔRT2 (No), the judgment portion 111 finishes the routine without making any other judgments.

As described above, with the present embodiment, a case where a deterioration (small short-circuit) has occurred in the secondary battery can be detected, and when the deterioration (small short-circuit) has occurred in the secondary battery, the internal resistance of the secondary battery is not calculated. Thus, with the present embodiment, calculation of an incorrect internal resistance can be avoided, which can contribute to a more correct diagnosis of the deterioration level and an anomaly of the secondary battery than by conventional technologies.

In this embodiment, the battery ECU 101 may be achieved by installing a program in a microcomputer for accomplishing various processes as shown in FIG. 2 and performing the program. In such a case, the CPU (central processing unit) of the microcomputer can function at least as the data set selection portion 105, the stored charge amount calculation portion 106, the stored charge amount change calculation portion 107, the internal-resistance-during-charging calculation portion 108, the internal-resistance-during-charging-and-discharging calculation portion 109, the difference computation portion 110, the judgment portion 111, and the predetermined value setting portion 112.

The method for detecting the state of a secondary battery and the device for detecting the state of a secondary battery according to the present invention have the advantage that the accuracy in estimating the value of internal resistance of the secondary battery as vehicles are running is improved and the deterioration level and an anomaly of the secondary battery can be diagnosed correctly, and thus are useful when applied to a pure electric vehicle (PEV), a hybrid electric vehicle (HEV), a hybrid electric vehicle having both a fuel cell and a secondary battery, or other electric vehicles or the like.

The embodiments disclosed in this application are in all respects for the purpose of describing the technical details of the invention, and the invention is not limited to such specific examples. Various changes can be made to the invention within the spirit of the invention and the scope of the appended claims, and the invention is to be construed broadly.

What is claimed is:

1. A method for detecting the state of a secondary battery, comprising:
   (a) a step of acquiring a plurality of data sets associating a current flowing through the secondary battery with a terminal voltage of the secondary battery corresponding to that current, wherein the plurality of data sets include (i) first data sets including first current data for the current in a charging direction and (ii) second data sets including second current data for the current in a discharging direction;
   (b) a step of making the plurality of data sets valid when specific selection conditions are satisfied;
   (c) a step of performing first statistical processing using the plurality of data sets including both the first data sets and the second data sets acquired during both charging and discharging, and calculating a first value of internal resistance in both the charging and discharging directions from the slope of a first linear approximation obtained by the first statistical processing;
   (d) a step of performing second statistical processing using first data sets acquired during charging, and calculating a second value of internal resistance in the charging direction from the slope of a second linear approximation obtained by the second statistical processing; and
   (e) a step of calculating a calculated value of internal resistance of the secondary battery based on the first value of internal resistance in both the charging and discharging directions and the second value of internal resistance in the charging direction.

2. The method for detecting the state of a secondary battery according to claim 1, further comprising:
   a step of judging whether or not an absolute value of the difference between the first value of internal resistance in both the charging and discharging directions and the second value of internal resistance in the charging direction is equal to or less than a first predetermined value,
   wherein, in step (e), when the absolute value of the difference between the first value of internal resistance in both the charging and discharging directions and the second value of internal resistance in the charging direction is equal to or less than the first predetermined value, then the calculated value of internal resistance of the secondary battery is calculated.

3. The method for detecting the state of a secondary battery according to claim 2, wherein, in step (e), when the absolute value of the difference between the first value of internal resistance in both the charging and discharging directions and the second value of internal resistance in the charging direction is equal to or less than the first predetermined value, then the first value of internal resistance in both the charging and discharging directions or the second value of internal resistance in the charging direction, whichever is smaller, is used as the calculated value of internal resistance of the secondary battery.

4. The method for detecting the state of a secondary battery according to claim 2, further comprising:
   a step of judging whether or not the first value of internal resistance in both the charging and discharging directions is greater than the second value of internal resistance in the charging direction, and
   a step of judging whether or not the difference between the first value of internal resistance in both the charging and discharging directions and the second value of internal resistance in the charging direction is greater than a second predetermined value that is greater than the first predetermined value,
   wherein, in step (e), when the absolute value of the difference between the first value of internal resistance in both the charging and discharging directions and the second value of internal resistance in the charging direction is greater than the first predetermined value, and further the first value of internal resistance in both the charging and discharging directions is greater than the second value of internal resistance in the charging direction and the difference between the first value of internal resistance in the charging and discharging directions and the second value of internal resistance in both the charging direction is greater than the second predetermined value, then a judgment that the secondary battery has deteriorated is made instead of calculating the calculated value of internal resistance of the secondary battery.

5. The method for detecting the state of a secondary battery according to claim 4, further comprising a step of setting the first predetermined value and a second predetermined value according to the temperature of the secondary battery.

6. The method for detecting the state of a secondary battery according to claim 1, wherein the specific selection conditions are conditions that are dependent on at least a change in the amount of stored charge of the secondary battery in a predetermined period of time, ranges of current values of the secondary battery in a charging direction and a discharging direction, numbers of the data sets in the charging direction and the discharging direction, and the temperature of the secondary battery.

7. A device for detecting the state of a secondary battery, comprising:
   a current measurement portion that measures the current flowing through the secondary battery as current data;
   a voltage measurement portion that measures the terminal voltage of the secondary battery as voltage data;
   a data set selection portion that acquires a plurality of data sets comprising the current data from the current measurement portion and the voltage data from the voltage measurement portion that corresponds to the current data, and that outputs the plurality of data sets as valid data sets when specific selection conditions are satisfied, wherein the plurality of data sets include (i) first data sets that include first current data for the current in a charging direction and (ii) second data sets including second current data for the current in the discharging direction;
   an internal-resistance-during-charging-and-discharging calculation portion that performs statistical processing on the plurality of data sets including the valid first data sets and the valid second data sets acquired during both charging and discharging, and calculating a first value of internal resistance in both the charging and discharging directions from the slope of a linear approximation obtained by the statistical processing;

an internal-resistance-during-charging calculation portion that performs statistical processing using the valid first data sets acquired during charging, and calculating a second value of internal resistance in the charging direction from the slope of a linear approximation obtained by the statistical processing;

a difference computation portion that calculates an absolute value of the difference between the first value of internal resistance in both the charging and discharging directions and the second value of internal resistance in the charging direction, and that also outputs a signal indicating the magnitude correlation between the first value of internal resistance in both the charging and discharging directions and the second value of internal resistance in the charging direction; and a judgment portion that judges whether or not the absolute value of the difference from the difference computation portion is equal to or less than a first predetermined value, and that outputs the first value of internal resistance in both the charging and discharging directions or the second value of internal resistance in the charging direction, whichever is smaller, as a calculated value of internal resistance of the secondary battery when the absolute value of the difference is equal to or less than the first predetermined value.

8. The device for detecting the state of a secondary battery according to claim 7, wherein when the absolute value of the difference between the first value of internal resistance in both the charging and discharging directions and the second value of internal resistance in the charging direction is greater than the first predetermined value, and further the first value of internal resistance in both the charging and discharging directions and discharging is greater than the second value of internal resistance in the charging direction and the difference between the first value of internal resistance in both the charging and discharging directions and the second value of internal resistance in the charging direction is greater than a second predetermined value that is greater than the first predetermined value, then the judgment portion judges that the secondary battery has deteriorated.

9. The device for detecting the state of a secondary battery according to claim 8, further comprising:

a temperature measurement portion that measures the temperature of the secondary battery; and a predetermined value setting portion that sets the first predetermined value and a second predetermined value according to the temperature of the secondary battery.

10. The device for detecting the state of a secondary battery according to claim 7, further comprising:

a stored charge amount change calculation portion that obtains a change in the amount of stored charge of the secondary battery in a predetermined period of time; and a temperature measurement portion that measures the temperature of the secondary battery, wherein when the specific selection conditions comprising at least the change in the amount of stored charge in the predetermined period of time, ranges of current values of the secondary battery in a charging direction and a discharging direction, numbers of the data sets in the charging direction and the discharging direction, the temperature of the secondary battery, and a deviation in the temperature of the secondary battery are satisfied, then the data set selection portion makes the plurality of data sets valid.

* * * * *